(12) United States Patent
Orsillo

(10) Patent No.: US 6,925,699 B1
(45) Date of Patent: Aug. 9, 2005

(54) METHOD OF PRODUCING A QUANTITY OF INTEGRATED CIRCUITS

(76) Inventor: James Orsillo, P.O. Box 68991, Portland, OR (US) 97268

( * ) Notice: Subject to any disclaimer, the term of this patent is extended or adjusted under 35 U.S.C. 154(b) by 354 days.

(21) Appl. No.: 10/107,082

(22) Filed: Mar. 25, 2002

Related U.S. Application Data

(62) Division of application No. 09/662,735, filed on Sep. 15, 2000, now Pat. No. 6,408,500.

(51) Int. Cl.[7] ............................................. G01R 29/00
(52) U.S. Cl. .................... 29/593; 29/401.1; 29/402.06; 324/758
(58) Field of Search .............................. 29/593, 401.1, 29/402.01, 402.04, 402.06, 402.08, 402.09, 29/402.14, 402.15, 557; 324/754, 758

(56) References Cited

U.S. PATENT DOCUMENTS

| | | | |
|---|---|---|---|
| 4,527,942 A | * | 7/1985 | Smith .......................... 414/590 |
| 4,588,346 A | * | 5/1986 | Smith .......................... 414/673 |
| 5,149,029 A | * | 9/1992 | Smith ........................ 248/124.2 |
| 5,264,787 A | | 11/1993 | Woith et al. ................. 324/158 |
| 5,440,943 A | * | 8/1995 | Holt et al. .................. 74/89.23 |
| 5,450,766 A | * | 9/1995 | Holt ........................... 73/866.5 |
| 5,528,158 A | | 6/1996 | Sinsheimer et al. ........ 324/758 |
| 5,552,701 A | * | 9/1996 | Veteran et al. ........... 324/158.1 |
| 5,608,334 A | * | 3/1997 | Holt ........................... 324/758 |
| 5,656,942 A | | 8/1997 | Watts et al. |
| 6,060,892 A | | 5/2000 | Yamagata .................... 324/754 |
| 6,114,869 A | | 9/2000 | Williams et al. ............ 324/765 |
| 6,166,553 A | | 12/2000 | Sinsheimer ................. 324/754 |
| 6,271,658 B1 | | 8/2001 | Vallinan et al. |
| 6,304,092 B1 | | 10/2001 | Jordan ........................ 324/758 |

FOREIGN PATENT DOCUMENTS

| | | |
|---|---|---|
| EP | 0699 913 A2 | 3/1996 |
| WO | WO 96/30772 | 10/1996 |

* cited by examiner

*Primary Examiner*—Richard Chang
(74) *Attorney, Agent, or Firm*—Klarquist Sparkman, LLP

(57) ABSTRACT

A method of producing a quantity of integrated circuits, that includes testing a set of semiconductor wafers that is made up of a first subset and a second subset. This first subset is configured in such a manner that a first tester is more readily adapted to perform the testing but the second subset is configured in such a manner that a second tester is more readily adapted to perform the testing. A first tooling plate and a second tooling plate are provided. The first tooling plate is attached to a probe station. Then the probe station is mated to the first tester to test the first subset of wafers. In turn, the second tooling plate is attached to the probe station. The probe station is then mated to the second tester to test the second subset of wafers. Finally, the first wafer and said second wafer are diced into the quantity of individual integrated circuits.

3 Claims, 4 Drawing Sheets

METHOD OF PRODUCING A QUANTITY OF INTEGRATED CIRCUITS

RELATED APPLICATIONS

This application is a divisional of U.S. patent application Ser. No. 09/662,735; Filing Date: Sep. 15, 2000 now U.S. Pat. No. 6,408,500.

BACKGROUND OF THE INVENTION

In the semiconductor field, each set of wafers fabricated is typically performance tested, before they are diced into individual integrated circuits. FIGS. 1–4 show equipment that is used in this testing. Although these figures show an embodiment of the invention they also show some features that are shared with prior art systems. These features are referenced in this section to help explain the context of the invention.

To perform wafer testing a piece of equipment known as a probe station 10 has a head plate 12 (FIG. 3) that defines an original head plate aperture 14. The aperture supports a circular device known as a probe card dish 16, which in turn supports the probe card 17. A separate piece of equipment, known as a tester 18 having docking units 20, is lowered into mating position with respect to the probe station, the probe card dish and the probe card. Sometimes probe station 10 includes an obstacle, such as a wafer loader cover 19, that is too close to the original head plate aperture 14 to permit the docking of a particular tester 18.

Generally, a number of guides and associated docking equipment pieces are needed to successfully dock a tester to a probe station, a probe card dish and the wafer that the probe card dish supports. Probe stations are generally sold to semiconductor manufacturing facilities with this docking equipment already installed. Accordingly, when a new tester is purchased it is typically necessary to purchase a new probe station fitted with docking equipment to facilitate docking with the new tester. Unfortunately, the docking equipment, which is typically installed by the probe station vendor or a secondary source, generally permits docking to a single make of tester. The installation of docking equipment to permit the use of a different tester with the probe station is referred to in the industry as "hardware swap-out" and results in extensive use of technician time and equipment down time.

It is known to machine a single prober to accept a single tooling plate that permits docking to a desired tester. There appears, however, not to have been an effort in the prior art to produce a set of standardized tooling plates that could each be used on any one of a set of differing probe stations. As a result, only very limited flexibility was gained by this method.

Another issue facing semiconductor manufacturers is the lack of uniformity of head plate apertures, between the various commercial lines of probe stations. The unfortunate result is that there is currently no known technique for mating a probe station having a first head plate aperture size with a tester designed to mate with a prober having a second head plate aperture size.

SUMMARY OF THE INVENTION

The present invention is a method of producing a quantity of integrated circuits that includes testing a set of semiconductor wafers that is made up of a first subset and a second subset. This first subset is configured in such a manner that a first tester is more readily adapted to perform the testing but the second subset is configured in such a manner that a second tester is more readily adapted to perform the testing. The method comprises the steps of creating, on the head plate, a head plate-tooling plate attachment region having fastening and alignment items. In addition, a first tooling plate and a second tooling plate are provided, each having fastening and alignment items adapted to mate to the head plate-tooling plate attachment region fastening and alignment items. Both tooling plates define an aperture designed to engage the predetermined probe card dish and including docking equipment adapted to facilitate docking to a unique tester out of said set of testers. The first tooling plate is attached to the head plate-tooling plate attachment region using the alignment and fastening items. Then the probe station is mated to the first tester to test the first subset of wafers. The first tooling plate is then removed from said head plate-tooling plate attachment region and the second tooling plate is attached to the head plate-tooling plate attachment region using the alignment and fastening items. The said probe station is then mated to the second tester to test the second subset of wafers. Finally, the first wafer and said second wafer are diced into the quantity of individual integrated circuits.

The foregoing and other objectives, features and advantages of the invention will be more readily understood upon consideration of the following detailed description of the preferred embodiment(s), taken in conjunction with the accompanying drawings.

DETAILED DESCRIPTION OF THE PREFERRED EMBODIMENTS

Figure 3:
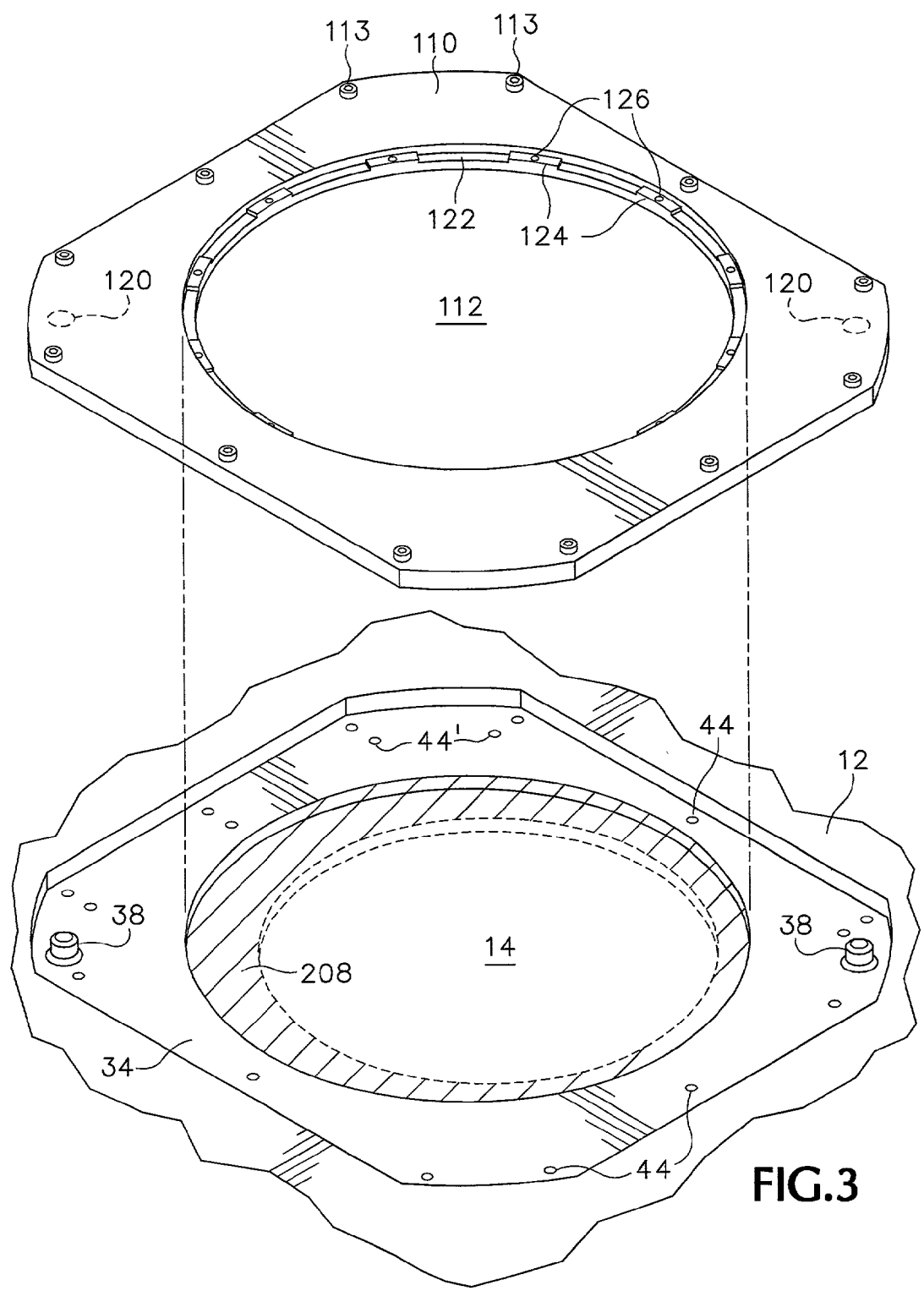
FIG. 3 is an exploded perspective view of a portion of the probe station of FIG. 1, showing some of the details of the retrofitting of the present invention.

One preferred method of manufacturing a quantity of integrated circuits begins with the retrofitting of a probe station. To begin, 0.3 mm (12 mils) of material is machined away from the top of the head plate 12 of the probe station 10 (both items have been introduced in the Background section) to form a head plate-tooling plate attachment region 34 (FIG. 3). A pair of through-holes (not shown) is drilled through the attachment region 34 of the head plate 12 to permit the attachment of a pair of dowel pins 38.

Figure 1:
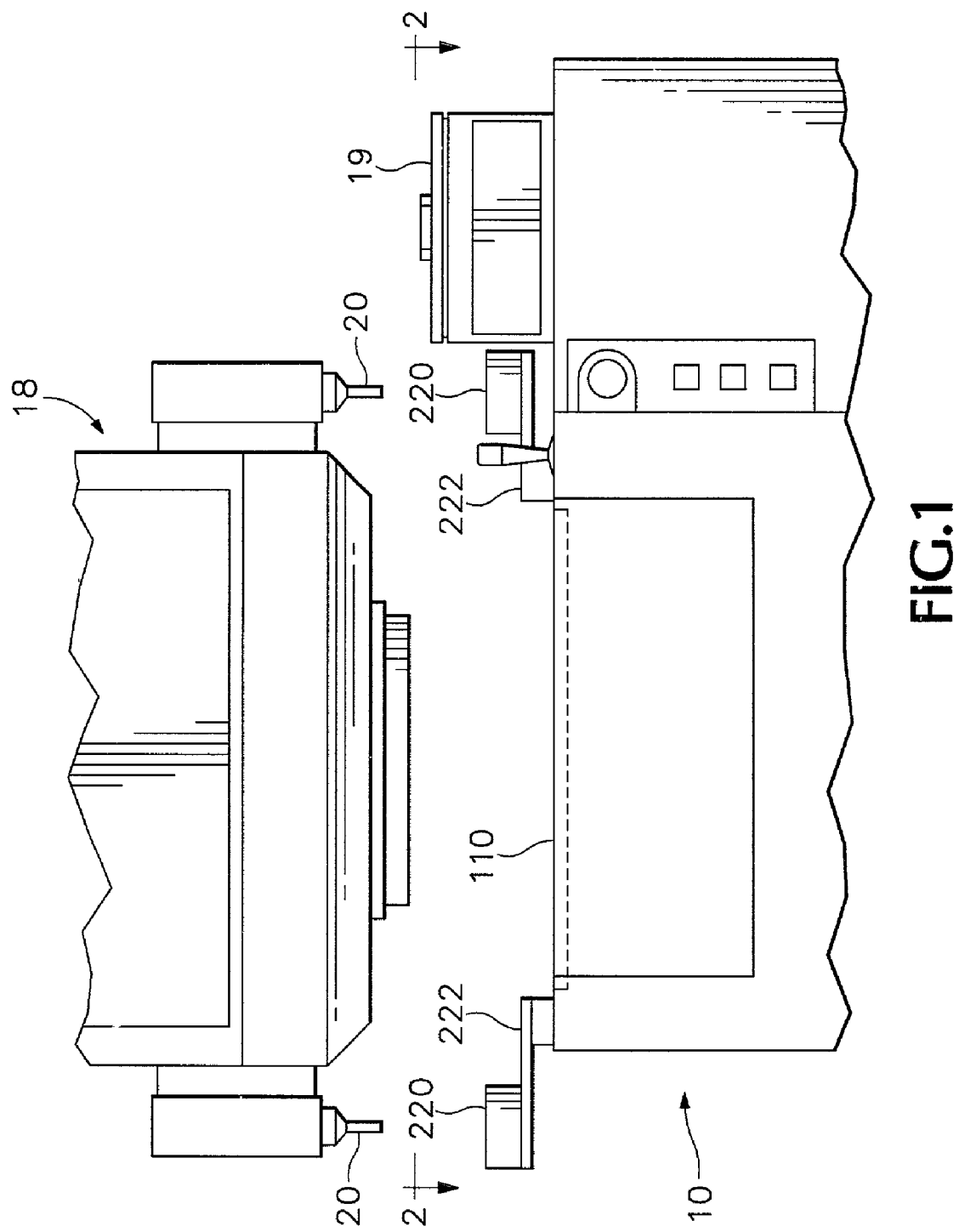
FIG. 1 is a side view of a probe station-tester mating pair wherein the probe station has been retrofitted according to the method of the present invention.
Figure 2:
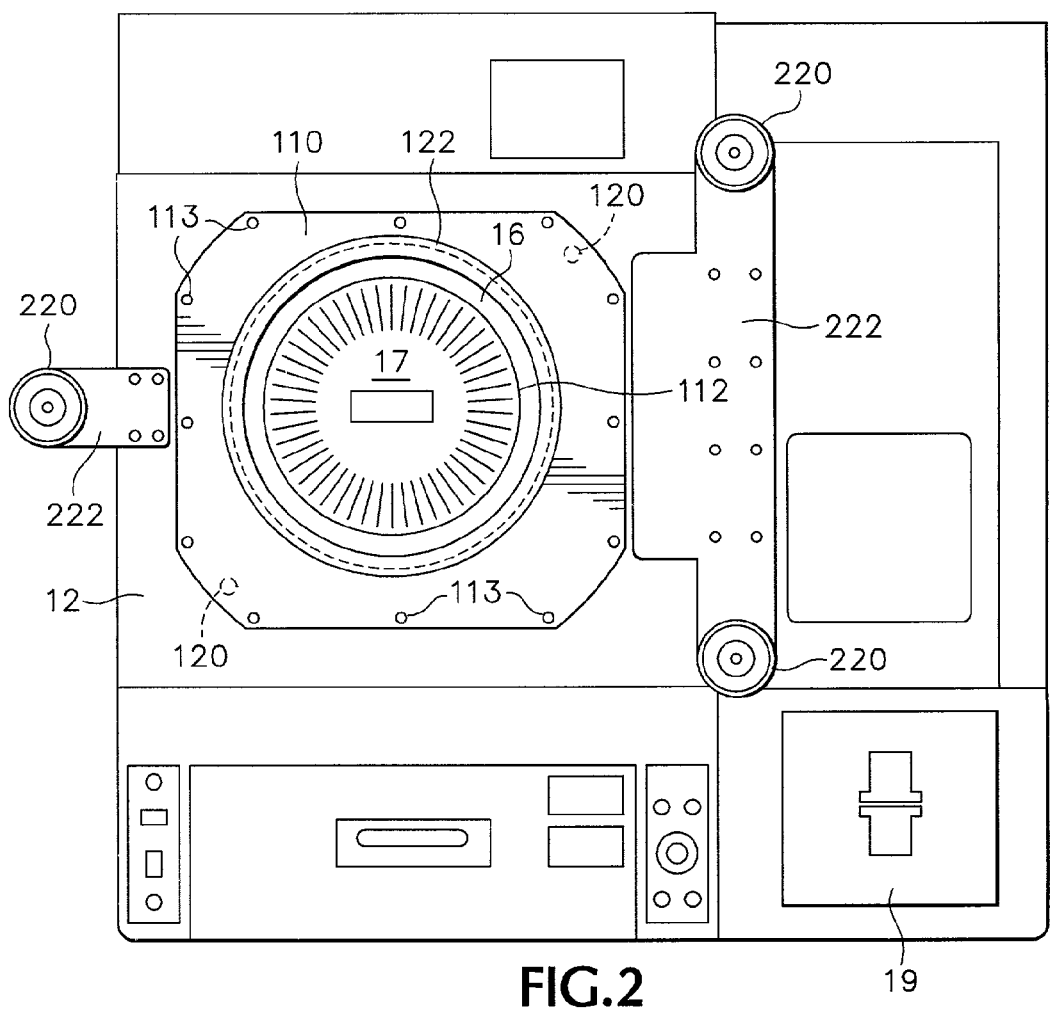
FIG. 2 is a top view of the probe station of FIG. 1.

In addition a sequence of threaded holes 44 are machined just inside the periphery of attachment region 34. The method of retrofitting a probe station that is the subject of the present invention is accomplished with the use of a tooling plate 110 as shown in FIGS. 1 and 2. Spring-loaded screws are set into a set of apertures 114, to permit the rapid attachment of plate 110 to a retrofitted probe station. The bottom side of plate 110 defines dowel pin locator holes 120, which are configured to mate with dowel pins 38 and thereby facilitate the precise positioning of plate 110. In one preferred embodiment the dowel pins 38 are sited with great precision relative to the center of aperture 14 to ensure correct alignment and positioning of a tooling plate 110.

Figure 4:
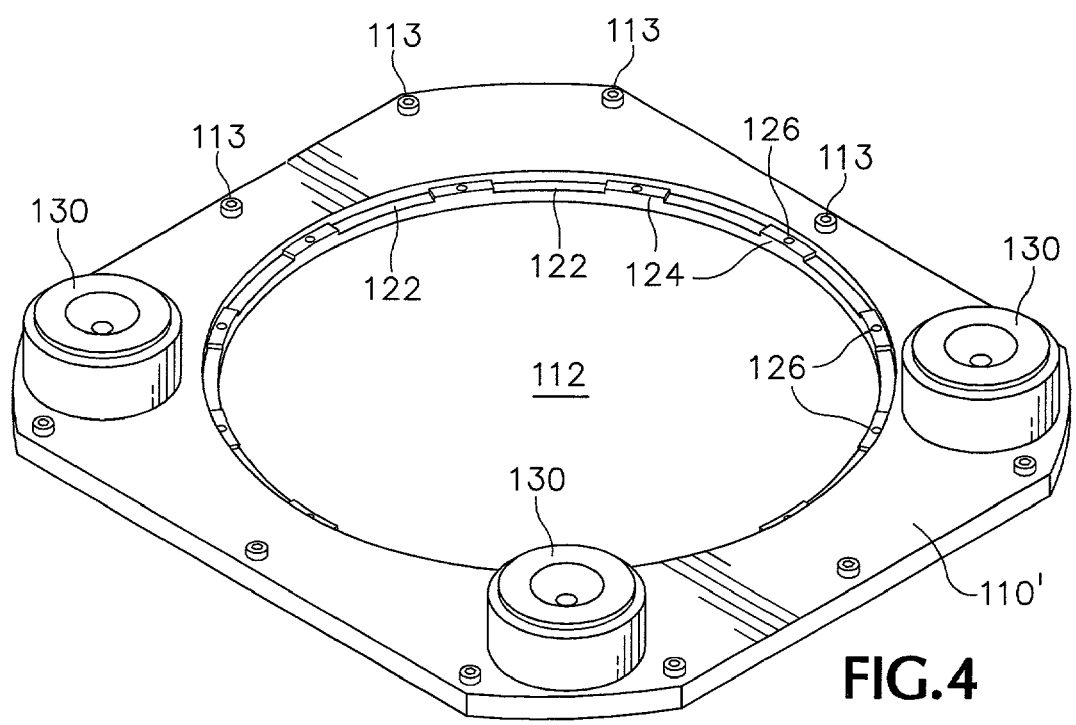
FIG. 4 is an exploded perspective view of a portion of a probe station that has been retrofitted in a manner similar to the method of FIG. 1, but with the docking equipment attached to the tooling plate.

The tooling plate 110, defines a tooling plate major aperture 120 for supporting a probe card dish. A rim 122, adapted for probe card dish attachment is defined about aperture 120. A set of bosses 124, each sunk with a threaded hole 126, ease the attachment of the probe card dish. Referring to FIG. 4, in some instances a set of docking equipment 130 is included as a part of plate 110 so that the installation of plate 110 renders the probe station 10 ready to dock with a tester of choice 18.

Ideally, a number of tooling plates 110 could be provided, each one fitted with a distinct set of docking equipment 130 adapted to dock with a particular tester. In this manner, a semiconductor manufacturing facility that owns a number of testers and a number of probe stations could dock any one of a number of testers with any one of a number of probe stations. Moreover, if more than one probe station was retrofitted to accept any one out of a number of tooling plates 110, than any one of these testers could be placed in service with any probe station for which a matable plate 110 was available.

It should be expressly noted that by producing a set of tooling plates, each of which has a standardized set of location and attachment items, and by modifying a set of probe stations so that each one has a standardized set of location and attachment items designed to mate to the tooling plate location and attachment items, that a great flexibility can be achieved in the sense that any of the probe stations can be mated to any of the tooling plates and thereby to any tester for which such a tooling plate is available. This technique appears to be unknown in the prior art and can be applied even to probe stations of differing makes, such as the popular brands TSK®, TEL® and EG®.

In an alternative preferred embodiment, no depression is machined in head plate 12. Dowell pins 38 and threaded holes 44 are provided on the top surface of head plate 12 and a tooling plate 110 is attached on top of head plate 12.

In one preferred embodiment a second set of threaded holes 44' is provided in head plate attachment region 34 for the attachment of a smaller tooling plate 110. Such a smaller tooling plate 110 would typically be made to fit a probe station 10 having a smaller head plate. By providing the second set of threaded holes 44' a probe station 10 is made available for retrofitting with tooling plates 110 made primarily for a different line of probe stations 10 having smaller head plates 12.

Referring again to FIGS. 1–2, in some instances, a probe station will have a head plate that is fairly small and will, further, have an obstacle 208 such as the cover for the device that loads the wafers onto the probe card dish (the "loader cover"). It may not be possible to dock this type of probe station to a tester without moving the probe card dish location away from the obstacle. To do this, the original head plate aperture 14 is enlarged and a tooling plate 210 is provided having a major aperture 212 that is not centered with respect to the remainder of the tooling plate 210. When tooling plate 210 is installed the major aperture 212 is located differently from the original head plate major aperture 14 and is further away from the obstacle, thereby permitting a tester of choice to dock to tooling plate 210 without encountering the obstacle.

In this embodiment the docking equipment 220 is included on a set of docking equipment plates 222. To facilitate the correct attachment of plates 222 to head plate 12, head plate 12 is machined in similar manner to the machining of attachment region 34 but nearer to its edge to form docking equipment plate attachment regions (not shown) which would include location and attachment items such as threaded holes and dowel pins.

It should be noted that to successfully implement the embodiment shown in FIGS. 1 and 2, that the software that drives the tester and probe station must be adjusted to account for the difference in location between the tooling plate major aperture 212 and head plate original major aperture 14.

Skilled persons will readily recognize that the purpose of the above-described operations, as noted in the BACKGROUND section of this application, is the testing of semiconductor wafers. Skilled persons will recognize that this is an essential step in the production of integrated circuits. Accordingly, a first wafer is tested with a first probe station tester configuration that includes a first tooling plate and a first docking equipment supporting plate. Then the probe station is reconfigured with a second tooling plate, and a second docking equipment supporting plate and mated with a second tester to test a second wafer. Both wafers are eventually diced into individual integrated circuits or chips, which may be packaged or sold in unpackaged form.

The terms and expressions which have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of producing a quantity of integrated circuits, that includes testing a set of semiconductor wafers that is made up of a first subset and a second subset, said first subset being configured in such a manner that a first tester is more readily adapted to perform said testing and said second subset being configured in such a manner that a second tester is more readily adapted to perform said testing, said method comprising the steps of:

(a) creating, on a head plate, a head plate-tooling plate attachment region having fastening and alignment items;

(b) providing a first tooling plate and a second tooling plate, each having fastening and alignment items adapted to mate to said head plate-tooling plate attachment region fastening and alignment items and each defining an aperture designed to engage a probe card dish and adapted to facilitate docking to a unique tester out of said set of testers;

(c) fastening said first tooling plate to said head plate-tooling plate attachment region using said alignment and fastening items;

(d) mating said probe station to said first tester to test said first subset of wafers;

(e) removing said first tooling plate from said head plate-tooling plate attachment region;

(f) fastening said second tooling plate to said head plate-tooling plate attachment region using said alignment and fastening items;

(g) mating said probe station to said second tester to test said second subset of wafers; and (h) dicing at least one wafer from said first subset and said second subset to create said quantity of integrated circuits.

2. The method of claim 1 wherein said first and second tooling plates further include docking equipment adapted to facilitate mating said first and second testers, respectively, to said probe station.

3. The method of claim 1 wherein said head plate-tooling plate attachment region fastening and alignment items include a first set of threaded holes positioned to permit the attachment of the first tooling plate, which has a first dimension and a second set of threaded holes positioned to permit the attachment of the second tooling plate, which has a second dimension.

\* \* \* \* \*